US010103187B2

(12) United States Patent
Chen et al.

(10) Patent No.: US 10,103,187 B2
(45) Date of Patent: Oct. 16, 2018

(54) IMAGE SENSOR COLOR CORRECTION

(71) Applicant: OMNIVISION TECHNOLOGIES, INC., Santa Clara, CA (US)

(72) Inventors: Qingfei Chen, Santa Clara, CA (US); Qingwei Shan, San Jose, CA (US); Chin-Chang Pai, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 79 days.

(21) Appl. No.: 14/973,017

(22) Filed: Dec. 17, 2015

(65) Prior Publication Data

US 2017/0180662 A1 Jun. 22, 2017

(51) Int. Cl.
  *H04N 5/369* (2011.01)
  *H04N 5/363* (2011.01)
  *H04N 5/3745* (2011.01)
  *H01L 27/146* (2006.01)

(52) U.S. Cl.
  CPC .. *H01L 27/14616* (2013.01); *H01L 27/14645* (2013.01); *H04N 5/363* (2013.01); *H04N 5/3698* (2013.01); *H04N 5/37457* (2013.01)

(58) Field of Classification Search
  CPC ............................ H04N 5/374–5/37457; H01L 27/14643–27/14663; H01L 27/14616
  USPC ................................. 348/311, 272, 268, 256
  See application file for complete search history.

(56) References Cited

U.S. PATENT DOCUMENTS

| | | | | |
|---|---|---|---|---|
| 2004/0119863 A1* | 6/2004 | Cho | ........................ | H04N 3/155 348/308 |
| 2004/0252214 A1* | 12/2004 | Ahn | ..................... | H04N 5/3575 348/308 |
| 2011/0187910 A1* | 8/2011 | Nikai | ..................... | H04N 5/357 348/308 |
| 2011/0194007 A1* | 8/2011 | Kim | ..................... | H04N 5/3575 348/308 |
| 2011/0261233 A1* | 10/2011 | Zhang | .................... | H04N 5/335 348/241 |
| 2013/0063641 A1* | 3/2013 | Venezia | ............ | H01L 27/14627 348/308 |
| 2014/0063304 A1* | 3/2014 | Manabe | ............... | H04N 5/3745 348/296 |
| 2015/0002718 A1* | 1/2015 | Nomura | ............. | H04N 5/37213 348/311 |

OTHER PUBLICATIONS

Taiwanese Office Action dated Dec. 14, 2017, for Taiwanese Application No. 105133940, filed Oct. 20, 2016, 15 pages.

* cited by examiner

*Primary Examiner* — Xi Wang
(74) *Attorney, Agent, or Firm* — Christensen O'Connor Johnson Kindness PLLC

(57) ABSTRACT

An image sensor includes a plurality of photodiodes disposed in a semiconductor material and a plurality of transfer transistors. Individual transfer transistors in the plurality of transfer transistors are coupled to individual photodiodes in the plurality of photodiodes. A floating diffusion is also coupled to the plurality of transfer transistors to receive image charge from the plurality of photodiodes. The floating diffusion is coupled to receive a preset voltage, and the preset voltage is substantially equal a dark condition steady-state read voltage.

19 Claims, 4 Drawing Sheets

IMAGE SENSOR COLOR CORRECTION

TECHNICAL FIELD

This disclosure relates generally to image sensor operation and in particular but not exclusively, relates to color correction in image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

In modern image sensors, color imaging is often accomplished by fabricating a color filter layer on the surface of the image sensor device. The color filter layer typically uses red, green, and blue color filters arranged into a pattern which allow missing color signals to be interpolated using a demosaicing algorithm. This technique allows for the reconstruction of color images resulting in little distortion to the final image.

However, despite advancements in color imaging, image sensors still may produce imperfect color signals for a variety of reasons. For instance, optical cross talk (i.e., the wrong color of light reaching a photodiode intended to receive another color of light) may cause certain colors to become artificially enhanced. Electrical cross talk (i.e., electrons flowing between two separate pixels) may result in image noise.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
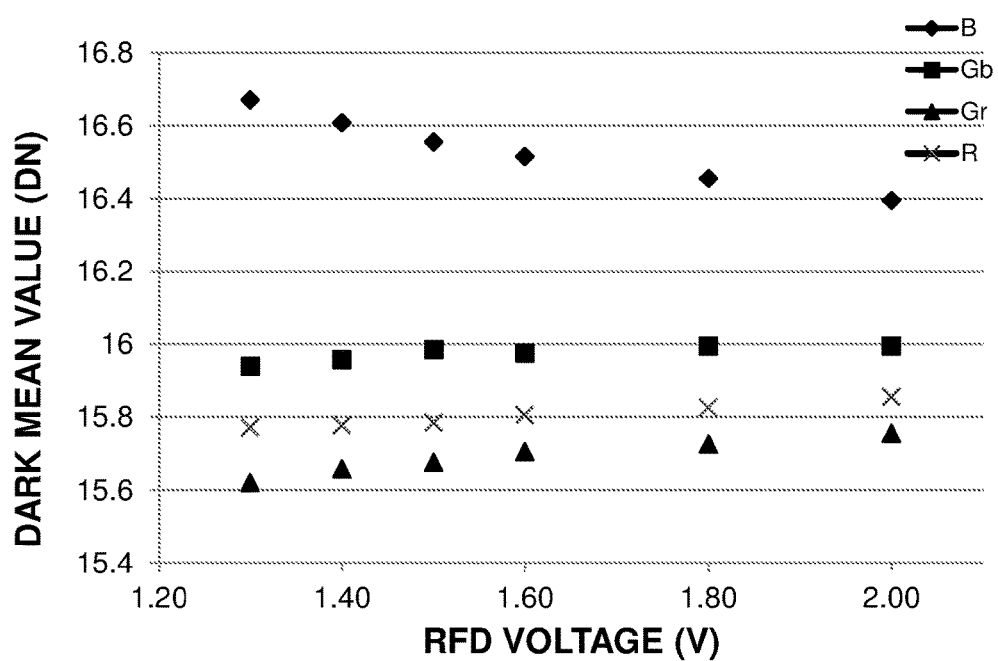
FIG. 1A is a graph illustrating the effects of color channel mismatch.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for image sensor color correction are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It is worth noting that specific elements of circuitry may be substituted for logically equivalent or analogous circuitry or may be emulated in software.

FIG. 1A is a graph illustrating the effects of color channel mismatch. Color channel mismatch refers to a phenomenon where pixels of one color output a greater signal than pixels of another color even in totally dark conditions. In other words, when no light is reaching the image sensor pixels, the image sensor pixels should all read out the same value since they are not generating any image charge (no photons are reaching the photodiodes). Sometimes, however, pixels of one color will output a higher base signal than pixels of another color. This may cause post-processing image artifacts and can distort images captured in low light conditions. FIG. 1A shows one example of this phenomenon where blue pixels (diamond-shaped line) are outputting a larger dark signal than green or red pixels. Examples in accordance with the teachings of the present invention remedy this problem by applying a pre-readout voltage to floating diffusions in the image sensor.

Figure 1B:
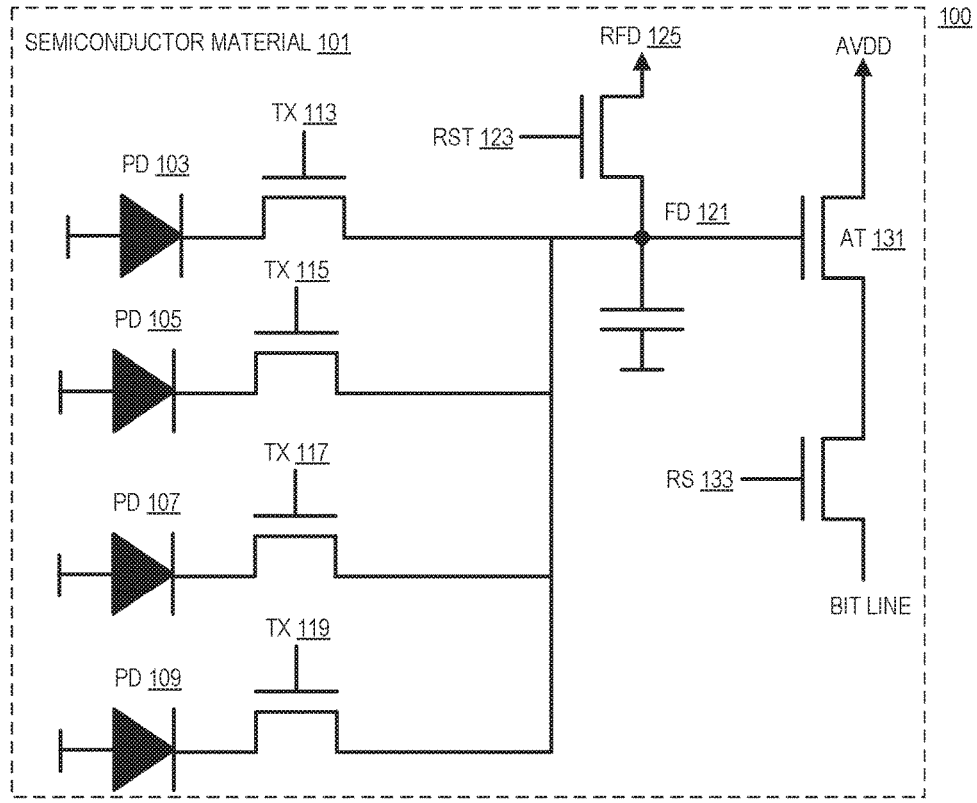
FIG. 1B is an illustration of an example image sensor, in accordance with the teachings of the present invention.

FIG. 1B is an illustration of a portion of an example image sensor 100. In the depicted example, image sensor 100 includes: semiconductor material 101, a plurality of photodiodes (PD 103, PD 105, PD 107, and PD 109), a plurality of transfer transistors (TX 113, TX 115, TX 117, and TX 119), floating diffusion 121, reset transistor 123, amplifier transistor 131, and row select transistor 133. The plurality of photodiodes is disposed in semiconductor material 101 to accumulate image charge in response to incident light directed into the plurality of photodiodes. In one example, semiconductor material 101 may include silicon, germanium, arsenic or other suitable semiconductors/dopants. A plurality of transfer transistors are also disposed in semiconductor material 101, and individual transfer transistors (TX 113, TX 115, TX 117, and TX 119) in the plurality of transfer transistors are coupled to individual photodiodes (PD 103, PD 105, PD 107, and PD 109) in the plurality of photodiodes. Floating diffusion 121 is disposed in semiconductor material 101, and floating diffusion 121 is coupled to the plurality of transfer transistors to receive image charge from the plurality of photodiodes in response to a transfer signal (see infra FIG. 1C, TX 113, TX 115, TX 117, and TX 119) sequentially applied to a control terminal of each individual transfer transistor. In other words, in the depicted example, a transfer signal is applied to the control terminal of TX 113, then a transfer signal is applied to the control terminal of TX 115, then a transfer signal is applied to the control terminal of TX 117, and finally a transfer signal is applied to the control terminal of TX 119. In one example, floating diffusion 121 is coupled to receive a preset voltage (e.g., preset voltage 151, see infra FIG. 1D), and the preset voltage is substantially equal to a dark condition steady-state read voltage (e.g., dark condition steady-state read voltage 161, see infra FIG. 1D), in accordance with the teachings of the present invention. In the depicted example, floating diffusion 121 is coupled to receive the preset voltage prior to reading out the image charge from first photodiode 103 in the plurality of photodiodes. Reset transistor 123 is coupled to floating diffusion 121 to extract the image charge from floating diffusion 121. Further, amplifier transistor 131 is coupled to floating diffusion 121, and row select transistor 133 is coupled between an output of amplifier transistor 131 and a bit line output. In one example, amplifier transistor 131 includes a source follower coupled transistor.

In the depicted example, the plurality of photodiodes includes four photodiodes coupled to floating diffusion 121. However, in a different example, any number of photodiodes may be coupled to floating diffusion 121 including two, six, and eight photodiodes. In the depicted example, the four photodiodes include two photodiodes 105/107 disposed to absorb green light, one photodiode 103 disposed to absorb blue light, and one photodiode 109 disposed to absorb red light. Although not depicted in FIG. 1B, color selection may be accomplished by placing a color filter layer proximate to semiconductor material 101. In one example, the color filter layer includes red, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

In one or more examples, other pieces of device architecture may be present in/on image sensor 100 such as encapsulation layers, pinning wells between photodiodes, and electrical isolation structures. In one example, image sensor 100 may be entirely disposed, in/on semiconductor material 101 and the internal components of image sensor 100 may be surrounded by electrical and/or optical isolation structures. This may help to reduce noise in image sensor 100. Electrical isolation may be accomplished by etching isolation trenches in semiconductor material 101 around individual photodiodes which may then be filled with semiconductor material, oxide material, or the like. Alternatively, optical isolation structures may be formed by constructing a reflective grid on the surface of semiconductor material 101 disposed beneath a color filter layer. The optical isolation structures may be optically aligned with the plurality of photodiodes.

Figure 1C:
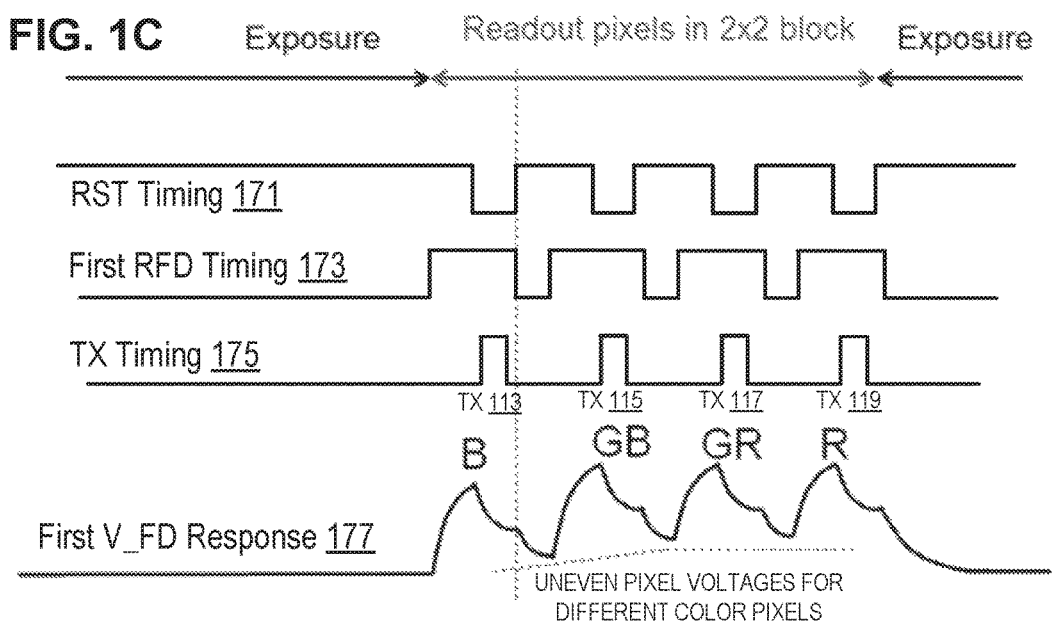
FIG. 1C shows an example first method of image sensor operation which may correspond to the image sensor in FIG. 1B.

FIG. 1C shows an example first method of image sensor operation, which may correspond to the image sensor in FIG. 1B, where the voltage on the floating diffusion 121 has not been adjusted to compensate for color channel mismatch. The depicted example shows several timing diagrams including: reset transistor timing (RST Timing 171), a first reset floating diffusion timing (First RFD Timing 173), transfer signal timing (TX Timing 175), and the resulting voltage on floating diffusion 121 when no preset voltage is applied (First V_FD Response 177). When image sensor 100 is in readout mode, RFD voltage may be set to a high level. In one example, the voltage level is determined by the charge transfer efficiency from photodiodes 103, 105, 107, 109 to floating diffusion 121 and the linearity of amplifier transistor 131. When image sensor 100 is in exposure mode, the RFD voltage may be determined by several performance metrics such as photodiode well capacity, photodiode blooming, and magnitude of dark current in the device. The RFD voltage in exposure mode is typically lower than the RFD voltage in readout mode. Image charge is transferred to floating diffusion 121 via application of a transfer signal (TX 113, TX 115, TX 117, and TX 119, see infra FIG. 1C) to the plurality of transfer transistors, and then the image charge is read out of floating diffusion 121. However, as shown in the depicted example, it should be noted that the readout voltage (First V_FD Response 177) on floating diffusion 121 increases for the first few photodiodes read out, and then stabilizes for photodiodes read out later in the series. In other words, image charge must be read out of floating diffusion 121 several times before floating diffusion 121 reaches its dark condition steady-state read voltage (e.g., dark condition steady-state read voltage 161). This disparity between pixel readout voltages may cause color channel mismatch (see e.g., FIG. 1A).

Figure 1D:
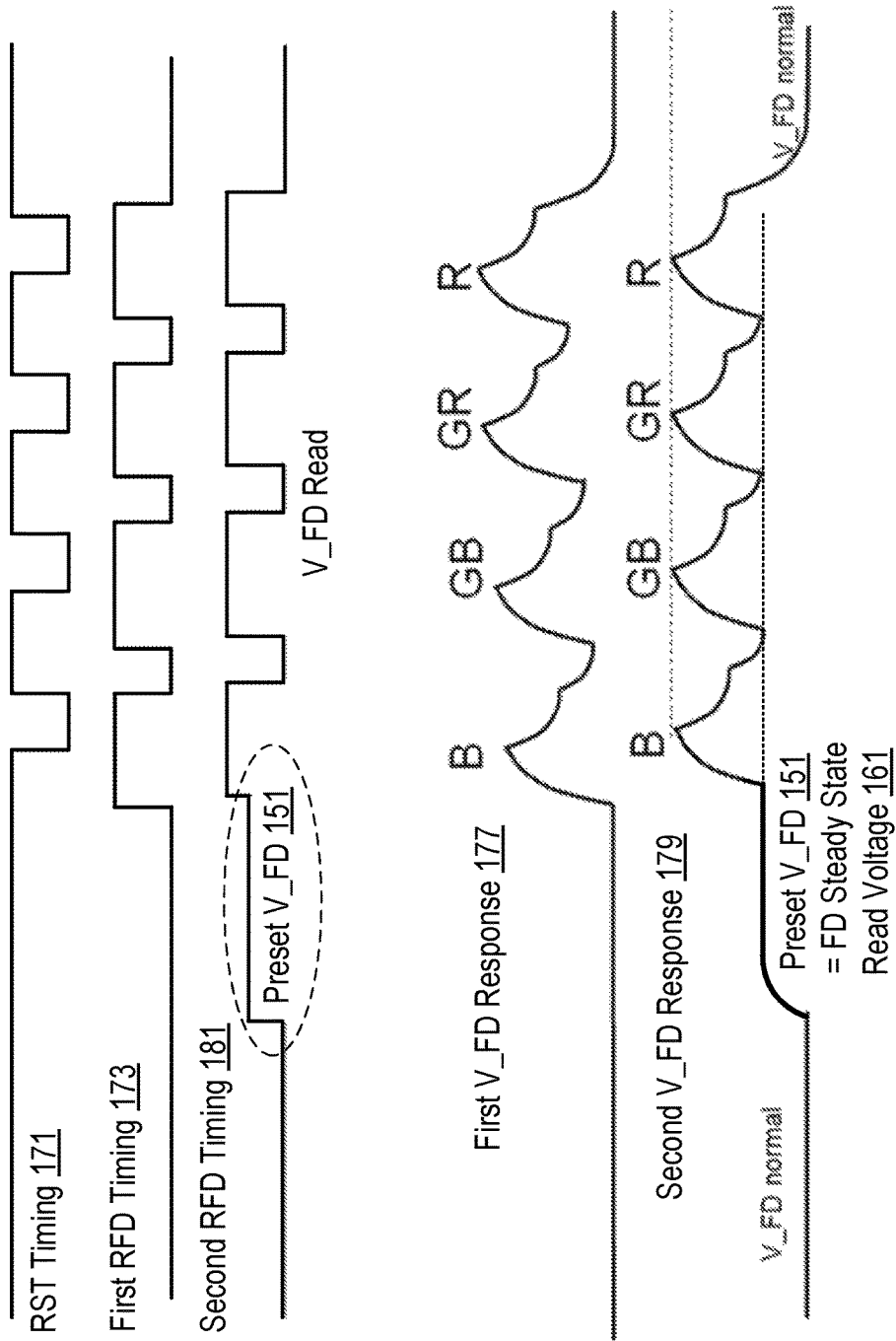
FIG. 1D shows an example second method of image sensor operation which may correspond to the image sensor in FIG. 1B, in accordance with the teachings of the present invention.

FIG. 1D shows an example second method of image sensor operation, which may correspond to the image sensor in FIG. 1B, where the voltage on the floating diffusion 121 has been adjusted to compensate for color channel mismatch by applying preset voltage 151. The depicted example shows several timing diagrams including: reset transistor timing (RST Timing 171—from FIG. 1C), a first reset floating diffusion timing (First RFD Timing 173—from FIG. 1C), a second reset floating diffusion timing (Second RFD Timing 181), the resulting voltage on floating diffusion 121 when no preset voltage is applied (First V_FD Response 177—from FIG. 1C), and the resulting voltage on floating diffusion 121 when preset voltage 151 is applied (Second V_FD Response 179). It is worth noting that the portions of FIG. 1C reproduced in FIG. 1D are provided to illustrate the differences between the two modes of operation (no preset voltage 151 is applied to floating diffusion 121 in FIG. 1C, whereas preset voltage 151 is applied to floating diffusion 121 in FIG. 1D).

As shown, RST timing 171 is the same in both FIG. 1C and FIG. 1D; however, second RFD timing 181 shows preset voltage 151 being applied to floating diffusion 121 to correct for color channel mismatch. Preset voltage 151 is applied for some period of time prior to the sequential readout of image charge from the plurality of photodiodes. In one example, this period of time may be fixed; however, in a different example this period of time may be dynamically determined and fluctuate depending on conditions in the image sensor. In one example, preset voltage 151 is applied to floating diffusion 121 for a period of time longer than a settling time (i.e., the amount of time necessary to achieve dark condition steady-state read voltage 161) of the plurality of photodiodes. In the depicted example, the magnitude of preset voltage 151 is dynamically determined to substantially equal dark condition steady-state read voltage 161. The magnitude of the preset voltage may be determined by: (1) reading out all photodiodes and determining the photodiodes' dark condition steady-state read voltage 161 (this may change depending on device temperature, operating conditions etc.); (2) storing the value of dark condition steady-state read voltage 161; and (3) applying a preset voltage 151 to floating diffusion 121 equal in magnitude to dark condition steady-state read voltage 161 during a subsequent image acquisition. Second V_FD Response 179 depicts the effect of applying preset voltage 151 to floating diffusion 121 in order to adjust the voltage on floating diffusion 121 to substantially equal the dark condition steady-state read voltage 161. As depicted, the photodiode read voltages are consistently level from the first read out cycle to the last read out cycle.

Figure 2:
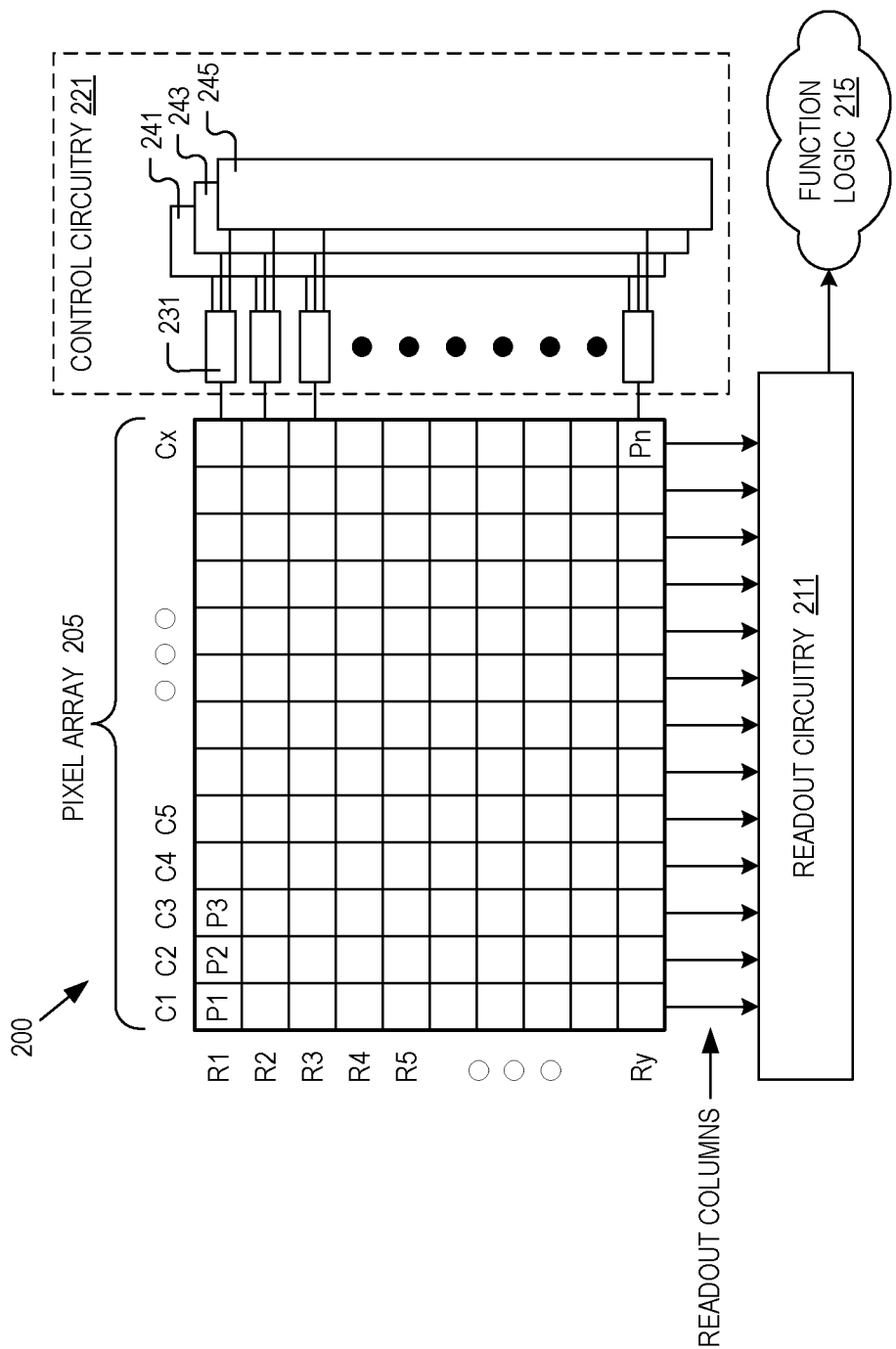
FIG. 2 is a block diagram illustrating one example of an imaging system including the image sensor of FIG. 1B, in accordance with the teachings of the present invention.

FIG. 2 is a block diagram illustrating one example of an imaging system including the image sensor of FIG. 1B. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., columns C1 to Cx) to acquire image data of a person, place, object, etc., which can then be used to render a 2D image of the person, place, object, etc.

In one example, after each image sensor photodiode/pixel in pixel array 205 has acquired its image data or image charge, the image data is read out by readout circuitry 211 and then transferred to function logic 215. Readout circuitry 211 may be coupled to read out image data from the plurality of photodiodes in pixel array 205. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may read out a row of image data at a time along readout column lines (illustrated) or may read out the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. However, in another example, the signal may be a rolling shutter signal to capture the image data in sequence. In another example, image acquisition is synchronized with lighting effects such as a flash. In the depicted example, control circuitry 221 also includes preset voltage address decoder 241 (coupled to supply the preset voltage), shutter address decoder 243 (coupled to control image sensor shuttering), and a readout address decoder 245. In one example, imaging system 200 may also include a row decoder and driver 231 where the row decoder and driver 231 is coupled between the plurality of photodiodes and the preset voltage address decoder 241, the shutter address decoder 243, and the readout address decoder 245.

In one example, imaging system 200 may be included in a digital camera, cell phone, laptop computer, or the like. Additionally, imaging system 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, manipulate image data supplied by imaging system 200, or reset image data in imaging system 200.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of photodiodes, including a first photodiode to receive blue light, a second photodiode to receive green light, and a third photodiode to receive red light, disposed in a semiconductor material to accumulate image charge in response to incident light directed into the plurality of photodiodes;
a plurality of transfer transistors, wherein individual transfer transistors in the plurality of transfer transistors are coupled to individual photodiodes in the plurality of photodiodes; and
a floating diffusion disposed in the semiconductor material, wherein the floating diffusion is coupled to the plurality of transfer transistors to receive the image charge from the plurality of photodiodes, and wherein the floating diffusion is coupled to receive a preset voltage, and the preset voltage is substantially equal to a dark condition steady-state read voltage to equalize a voltage readout of the first photodiode, the second photodiode, and the third photodiode, wherein a magnitude of the preset voltage is dynamically determined in response to reading out the first photodiode, the second photodiode, and the third photodiode.

2. The image sensor of claim 1, wherein the individual photodiodes are coupled to the individual transfer transistors to read out the image charge to the floating diffusion in response to a transfer signal sequentially applied to a control terminal of each individual transfer transistor, and wherein the floating diffusion is coupled to receive the preset voltage prior to reading out the image charge from a first photodiode in the plurality of photodiodes.

3. The image sensor of claim 2, wherein the preset voltage is applied to the floating diffusion for a period of time longer than a settling time of the plurality of photodiodes.

4. The image sensor of claim 3, wherein the period of time that the preset voltage is applied to the floating diffusion is fixed.

5. The image sensor of claim 1, further comprising a reset transistor coupled to the floating diffusion, wherein the reset transistor is coupled to extract the image charge from the floating diffusion.

6. The image sensor of claim 1, further comprising an amplifier transistor coupled to the floating diffusion; and
   a row select transistor coupled between an output of the amplifier transistor and a bit line output.

7. The image sensor of claim 6, wherein the amplifier transistor includes a source follower coupled transistor.

8. The image sensor of claim 1, further comprising control circuitry and readout circuitry, wherein the control circuitry controls operation of the plurality of photodiodes, and the readout circuitry reads out the image charge from the plurality of photodiodes.

9. The image sensor of claim 8, wherein the control circuitry includes:
   a preset voltage address decoder coupled to supply the preset voltage;
   a shutter address decoder coupled to control image sensor shuttering; and
   a readout address decoder coupled to control readout of the image charge.

10. The image sensor of claim 9, further comprising a row decoder and driver, wherein the row decoder and driver is coupled to the plurality of photodiodes, and wherein the row decoder and driver is coupled to the preset voltage address decoder, the shutter address decoder, and the readout address decoder.

11. The image sensor of claim 1, wherein the dark condition steady-state read voltage is different than a power supply voltage.

12. An imaging system, comprising
   a plurality of photodiodes, including a first photodiode to receive blue light, a second photodiode to receive green light, and a third photodiode to receive red light;
   a plurality of transfer transistors, wherein individual transfer transistors in the plurality of transfer transistors are coupled to individual photodiodes in the plurality of photodiodes;
   a floating diffusion coupled to the plurality of transfer transistors to receive image charge from the plurality of photodiodes, and wherein the floating diffusion is coupled to receive a preset voltage, and the preset voltage is substantially equal to a dark condition steady-state read voltage to equalize a voltage readout of the first photodiode, the second photodiode, and the third photodiode, wherein a magnitude of the preset voltage is dynamically determined in response to reading out the first photodiode, the second photodiode, and the third photodiode, and wherein the floating diffusion is coupled to receive the preset voltage prior to reading out the image charge from the plurality of photodiodes; and
   a preset voltage address decoder coupled to supply the preset voltage to the floating diffusion.

13. The imaging system of claim 12, wherein the preset voltage is applied to the floating diffusion for a period of time longer than a settling time of the plurality of photodiodes.

14. The imaging system of claim 12, further comprising a shutter address decoder coupled to control imaging system shuttering;
   a readout address decoder; and
   a row decoder and driver, wherein the row decoder and driver is coupled to the plurality of photodiodes, and wherein the row decoder and driver is coupled to the preset voltage address decoder, the shutter address decoder, and the readout address decoder.

15. The imaging system of claim 12, further comprising readout circuitry and function logic, wherein the readout circuitry reads out the image data from the plurality of photodiodes, and wherein the readout circuitry is coupled to function logic.

16. A method of image sensor operation, comprising:
   applying a preset voltage to a floating diffusion, wherein the preset voltage is substantially equal to a dark condition steady-state read voltage to equalize a voltage readout of a first photodiode, a second photodiode, and a third photodiode, wherein a magnitude of the preset voltage is dynamically determined in response to reading out the first photodiode, the second photodiode, and the third photodiode, wherein the first photodiode receives blue light, the second photodiode receive green light, and the third photodiode receives red light;
   generating image charge in the plurality of photodiodes, including the first photodiode, the second photodiode, and the third photodiode, in response to incident light; and
   transferring the image charge from the plurality of photodiodes to the floating diffusion via individual transfer transistors coupled to the plurality of photodiodes, wherein the transfer transistors sequentially transfer the image charge from the plurality of photodiodes to the floating diffusion in response to a transfer signal, and wherein said applying the preset voltage to the floating diffusion occurs prior to transferring the image charge from the plurality of photodiodes.

17. The method of claim 16, wherein the preset voltage is applied to the floating diffusion for a period of time longer than a settling time of the plurality of photodiodes.

18. The image sensor of claim 1, wherein the period of time that the preset voltage is applied to the floating diffusion is determined dynamically in response to reading out the first photodiode, the second photodiode, and the third photodiode.

19. The image sensor of claim 1, wherein the magnitude of the preset voltage changes in response to temperature of the image sensor.

* * * * *